(12) United States Patent
Tanaka et al.

(10) Patent No.: US 10,042,250 B2
(45) Date of Patent: Aug. 7, 2018

(54) IMPRINT APPARATUS, IMPRINTING MOLD, AND METHOD OF MANUFACTURING ARTICLE

(71) Applicant: CANON KABUSHIKI KAISHA, Tokyo (JP)

(72) Inventors: Yusuke Tanaka, Utsunomiya (JP); Hirotoshi Torii, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 771 days.

(21) Appl. No.: 14/533,992

(22) Filed: Nov. 5, 2014

(65) Prior Publication Data

US 2015/0123313 A1 May 7, 2015

(30) Foreign Application Priority Data

Nov. 7, 2013 (JP) ................................. 2013-231575

(51) Int. Cl.
*G03F 7/00* (2006.01)

(52) U.S. Cl.
CPC .................................. *G03F 7/0002* (2013.01)

(58) Field of Classification Search
CPC ................. G03F 7/0002; G03F 9/7003; B29C 2059/023
See application file for complete search history.

(56) References Cited

U.S. PATENT DOCUMENTS

| 2012/0007279 | A1* | 1/2012 | Torii | B29C 33/303 264/293 |
| 2013/0112097 | A1* | 5/2013 | Nakagawa | G03F 7/0002 101/483 |

FOREIGN PATENT DOCUMENTS

| JP | 2008-504141 A | 2/2008 |
| JP | 2009-141328 A | 6/2009 |
| JP | 2011037261 A | 2/2011 |
| JP | 2012-23092 A | 2/2012 |
| JP | 2012-160635 A | 8/2012 |
| JP | 2013-110162 A | 6/2013 |

* cited by examiner

*Primary Examiner* — Alison L Hindenlang
*Assistant Examiner* — Cedrick S Williams
(74) *Attorney, Agent, or Firm* — Canon U.S.A., Inc. IP Division

(57) ABSTRACT

An imprint apparatus for forming a pattern on a substrate by contacting an imprint material on the substrate with a mold includes a mold holding member configured to hold the mold and a mold deforming mechanism for applying a force to a side surface of the mold in a direction along a pattern face of the mold in which the pattern is formed in order to deform the pattern formed in the mold held by the mold holding member. The mold deforming mechanism includes a contact portion to contact with the side surface of the mold to press against the side surface. The contact portion is shaped such that a dimension of part of the contact portion to contact with the side surface of the mold is less than a dimension of part of the contact portion away from the side surface of the mold.

13 Claims, 11 Drawing Sheets

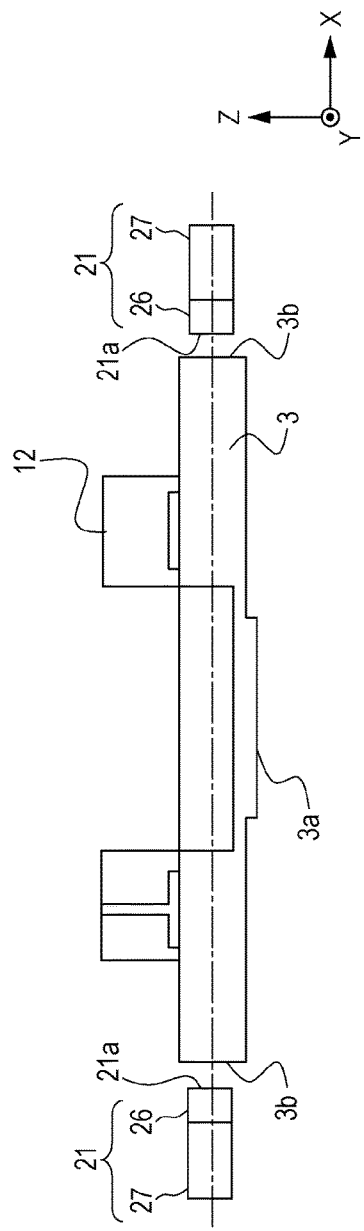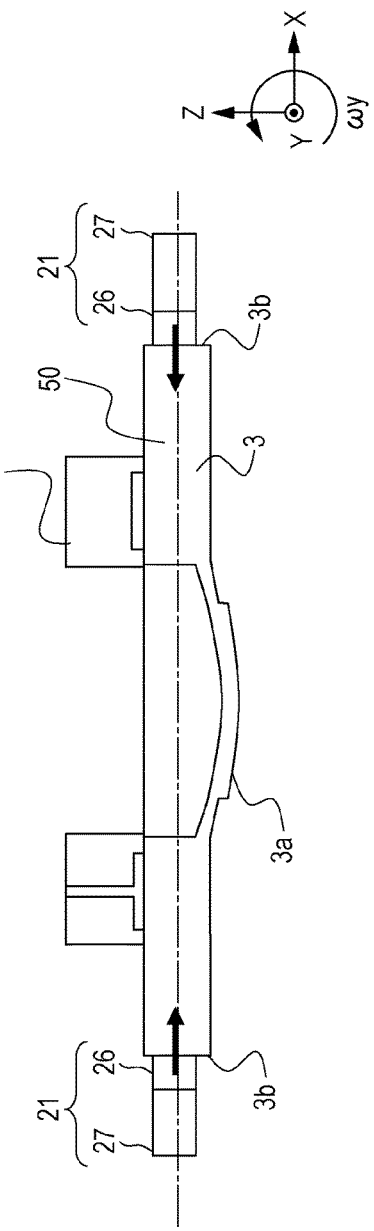

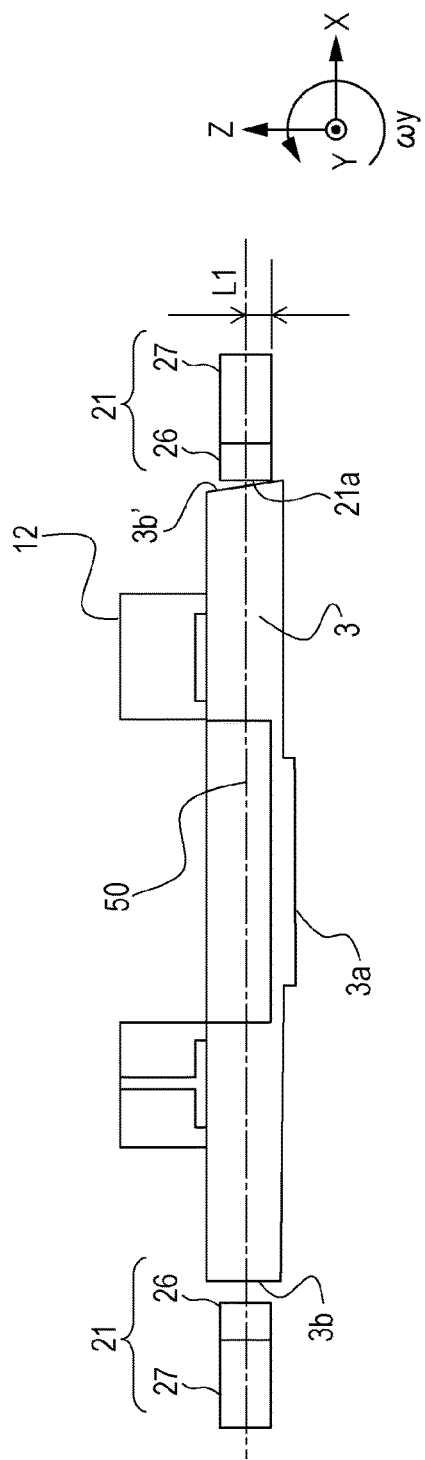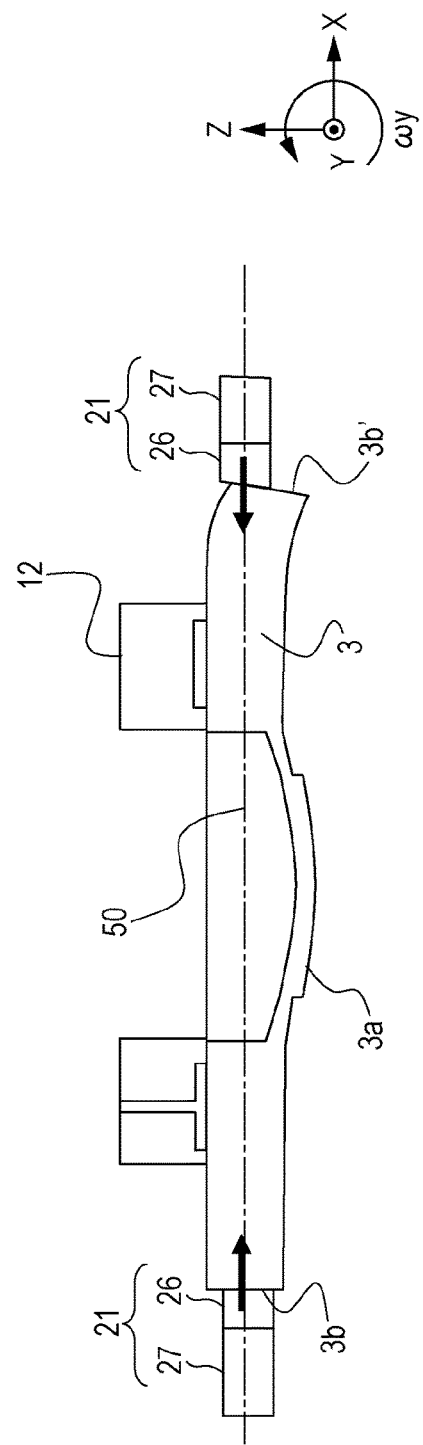

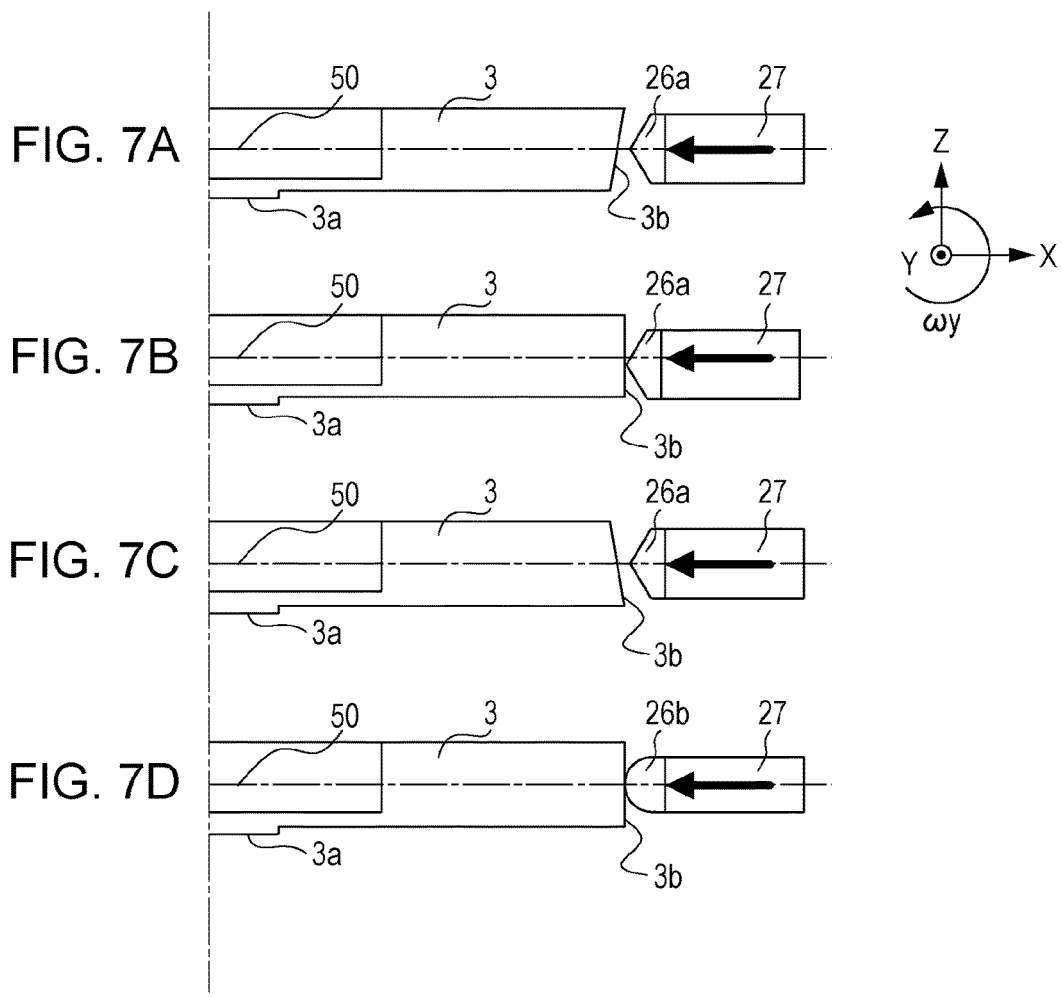

FIG. 8A 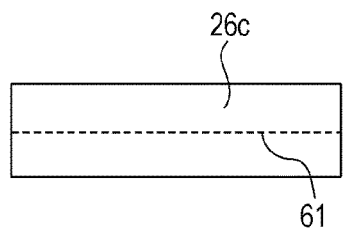 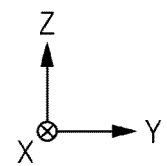
FIG. 8B 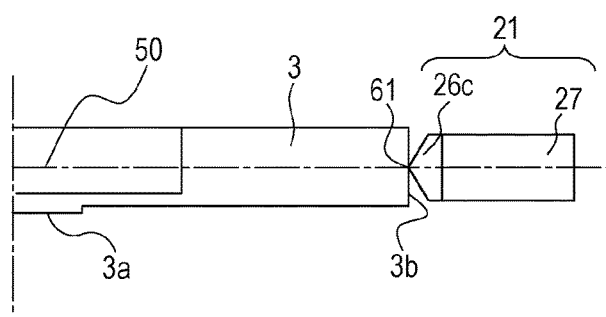 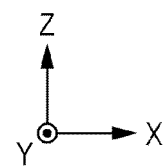
FIG. 8C 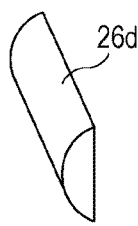 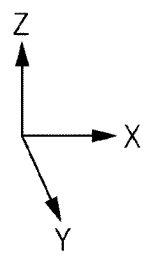
FIG. 8D 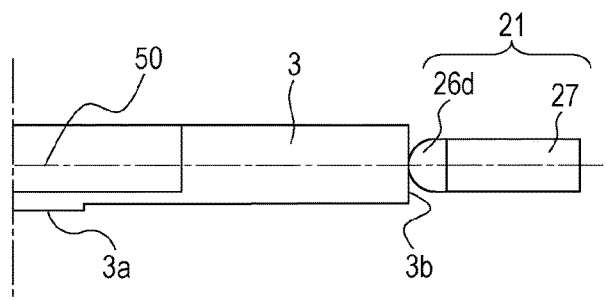 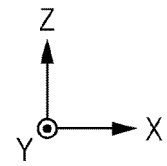

IMPRINT APPARATUS, IMPRINTING MOLD, AND METHOD OF MANUFACTURING ARTICLE

BACKGROUND

Field

The present disclosure relates to an imprint apparatus for forming a pattern on a substrate by contacting an imprint material on the substrate with a mold, an imprinting mold, and a method of manufacturing an article.

Description of the Related Art

Demands for miniaturization of semiconductor devices are increasing and attention is focused on microfabrication techniques as well as known photolithography techniques. A microfabrication technique is to form a fine pattern on a substrate by contacting an imprint material on the substrate with a mold having a micro-relief pattern. This technique, called an "imprinting technique", enables a fine structure on the order of a few nanometers to be formed on a substrate. Examples of imprinting techniques includes a photo-curing method. According to the photo-curing method, first, a shot area (imprint area) of a substrate (wafer) is coated with an imprint material, such as an ultraviolet (UV) curable resin or a photo-curable resin. Then, the imprint material is brought into contact with a mold such that they are pressed against each other. The imprint material in contact with the mold is irradiated with light (UV light), thus curing the imprint material. Lastly, the mold is separated or released from the cured imprint material, so that a pattern is formed on the substrate.

An imprint apparatus using the above-described technique typically includes a magnification correction mechanism to correct a pattern magnification error generated during a semiconductor process. The magnification correction mechanism includes a contact portion to contact with a mold and a sensor for controlling an amount of driving the contact portion. A plurality of magnification correction mechanisms are arranged so as to surround the mold. In this case, each magnification correction mechanism applies an external force to the mold to deform the mold, thus correcting the shape of a pattern formed in the mold. At this time, the pattern shape affects overlay precision with a pattern previously formed on a substrate. Accordingly, a highly accurate correction on the order of a few nanometers is required for pattern miniaturization. For example, PCT Japanese Translation Patent Publication No. 2008-504141 discloses a correction apparatus which corrects a magnification by applying a compressive force to a side surface of a mold. Japanese Patent Laid-Open No. 2009-141328 discloses an imprint apparatus including actuators arranged between each side surface of a mold and a support structure and force sensors each of which is disposed between the actuator and the support structure. Each actuator applies a compressive force to the side surface of the mold and each force sensor controls the amount of driving the actuator. Japanese Patent Laid-Open No. 2012-23092 discloses an imprint apparatus in which a position to be detected by a displacement sensor for detecting a position of a side surface of a mold is located in a plane in which a contact portion comes into contact with the mold.

The contact portions of the magnification correction mechanisms are in contact with the mold. The contact portions are pressed parallel to a pattern face of the mold, thus deforming the mold in a direction parallel to the pattern face. Each side surface of the mold is not necessarily perpendicular to the pattern face because of a manufacturing error or the like. Accordingly, a state of contact between each contact portion and the mold varies depending on position. Unfortunately, forces are applied to the mold in a Z direction (perpendicular to the pattern face of the mold) such that the magnitude and direction of the force vary from position to position. The forces are applied to the mold in the Z direction in this manner, so that the mold is deformed into a complex shape and the accuracy of correcting the pattern shape is reduced. This may lead to lower overlay precision with the pattern on the substrate.

SUMMARY

Aspects disclosed herein are made in consideration of the above-described disadvantages and provides an imprint apparatus that is effective in correcting the shape of a pattern in a mold.

The present disclosure provides an imprint apparatus for forming a pattern on a substrate by contacting an imprint material on the substrate with a mold, the apparatus including a mold holding member configured to hold the mold and a mold deforming mechanism for applying a force to a side surface of the mold in a direction along a pattern face of the mold in which the pattern is formed in order to deform the pattern formed in the mold held by the mold holding member. The mold deforming mechanism includes a contact portion to contact with the side surface of the mold to press against the side surface. The contact portion is shaped such that a dimension of part of the contact portion to contact with the side surface of the mold is less than a dimension of part of the contact portion away from the side surface of the mold.

Further features of the present disclosure will become apparent from the following description of exemplary embodiments with reference to the attached drawings.

BRIEF DESCRIPTION OF THE DRAWINGS

FIGS. 5A and 5B are diagrams illustrating states of a mold before and after pressing.

FIGS. 6A and 6B are schematic diagrams illustrating deformation of a mold having a processing error.

FIGS. 7A to 7D are diagrams illustrating side surfaces of molds having processing errors and contact states of extremities.

FIGS. 8A to 8D are diagrams illustrating shapes of extremities and states of contact between the side surface of the mold and the extremities.

DESCRIPTION OF THE EMBODIMENTS

Embodiments of the present disclosure will be described below in detail with reference to the attached drawings.

Imprint Apparatus

Figure 1:
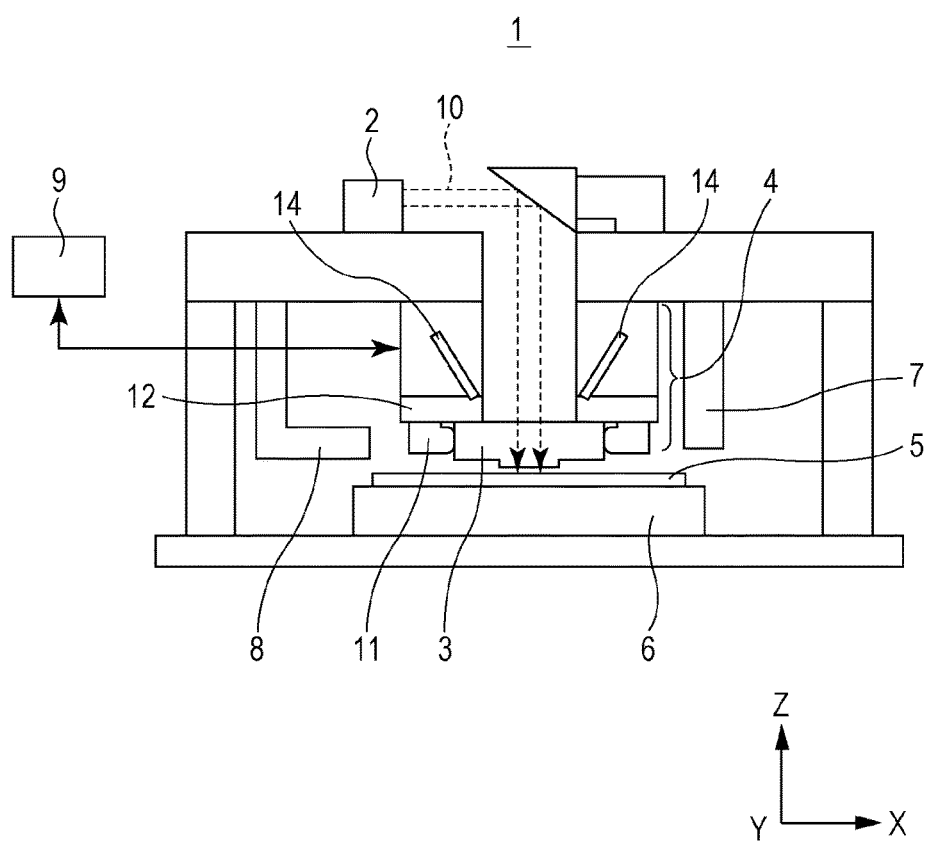
FIG. 1 is a schematic diagram illustrating an exemplary configuration of an imprint apparatus according to a general embodiment.

An exemplary configuration of an imprint apparatus according to a general embodiment of the present disclosure will now be described. FIG. 1 is a schematic diagram of the configuration of the imprint apparatus indicated at 1. The imprint apparatus 1 according to this embodiment is a processing machine, used in a process of manufacturing a semiconductor device, to transfer a relief pattern in a mold to an imprint material applied to a substrate (wafer). The imprint apparatus according to the embodiment uses the photo-curing method which is one of imprinting techniques and in which an imprint material is cured by UV irradiation. In the following description, a Z axis is parallel to the axis of UV radiation to a mold, an X axis corresponds to a direction in which any one of magnification correction mechanisms (mold deforming mechanisms, which will be described later) is driven within a plane perpendicular to the Z axis, and a Y axis is orthogonal to the X axis. The imprint apparatus 1 according to the embodiment includes an irradiation system unit 2, a mold holder 4 to hold a mold 3, a substrate stage 6 to hold a substrate 5, a coating device 7, a mold conveyor 8, and a controller 9.

The irradiation system unit 2 is an irradiation device to irradiate an imprint material on the substrate with UV light 10 in order to cure the imprint material. The irradiation system unit 2 includes a light source and a plurality of optical elements for adjusting UV light emitted from the light source to light suitable for imprinting (or a pattern area). The mold (metal mold) 3 has a rectangular outer shape and has a predetermined pattern (e.g., a relief pattern, such as a circuit pattern) which is three-dimensionally formed in a face facing the substrate 5. The pattern in the mold 3 has a processed surface with high flatness to ensure tight contact with a surface of the substrate 5. The mold 3 is made of a material (e.g., quartz) that allows UV light to pass therethrough because UV light emitted from the irradiation system unit 2 passes through the mold and is then applied to the imprint material.

The mold holder 4 is a holding device to hold and secure the mold 3. The mold holder 4 includes mold deforming mechanisms 11 to apply a compressive force to the mold 3 in order to deform (correct) the pattern formed in the mold 3 into a target pattern shape. The mold holder 4 further includes a mold holding member (mold base) 12 to attract and hold the mold 3 with an attraction force or an electrostatic force. Additionally, the mold holder 4 includes a mold-holding-member driving mechanism (not illustrated) to drive the mold holding member 12 in the Z direction. Specifically, the mold-holding-member driving mechanism is a driving system to drive the mold holding member 12 in the Z direction in order to contact the imprint material applied to the substrate 5 with the mold 3 (imprinting operation). Any actuator driving in at least the Z direction may be included in the driving mechanism. A linear motor or an air cylinder may be used. Alternatively, an actuator that performs a coarse motion and a fine motion separately may be used to achieve a high-accuracy releasing operation so as to prevent the cured imprint material from being broken when the mold 3 is released from the cured imprint material. Although the imprinting operation and the releasing operation may be achieved by driving the mold holding member 12 (the mold 3) in the Z direction, these operations may be achieved by driving the substrate stage 6 (the substrate 5) in the Z direction. Alternatively, the imprinting operation and the releasing operation may be performed by driving the mold holding member 12 and the substrate stage 6 in the Z direction.

The substrate 5 is a substrate (wafer) to be processed made of, for example, monocrystalline silicon. A surface to be processed of the substrate 5 is coated with an imprint material (UV curable resin) to be patterned. The substrate stage 6 is a substrate holding unit that holds the substrate 5 by vacuum suction and that is movable in an X-Y plane. Although a linear motor can be used as an actuator to drive the substrate stage 6, any other actuator may be used. The coating device (dispenser) 7 is a coating unit to coat the substrate 5 with the imprint material (curable resin). The imprint material is a photo-curable resin that is curable by light irradiation. The imprint material is properly selected depending on the type of semiconductor device to be manufactured. The wavelength of light applied for curing is also properly selected depending on the type of photo-curable resin. The mold conveyor 8 is a conveying unit to convey the mold 3 and dispose the mold 3 on the mold holding member 12.

The controller 9 is a control unit to control operations of the components of the imprint apparatus 1 and adjust the components. The controller 9 includes a computer or sequencer (not illustrated) that is connected to the components of the imprint apparatus 1 by lines and that includes a memory, such as a magnetic storage medium. The controller 9 controls the components in accordance with a program or a sequence. In this embodiment, the controller 9 properly adjusts a clamping force (attraction force) of the mold holding member 12 and further controls, for example, operations of the mold deforming mechanisms 11 and a gas supply unit included in the mold holder 4, which will be described later. The controller 9 may be integrated with the imprint apparatus 1 or may be located separately from the imprint apparatus 1 and remotely control the imprint apparatus 1.

Embodiments

A mold holder 4 according to an embodiment of the present disclosure will now be described.

Figure 2:
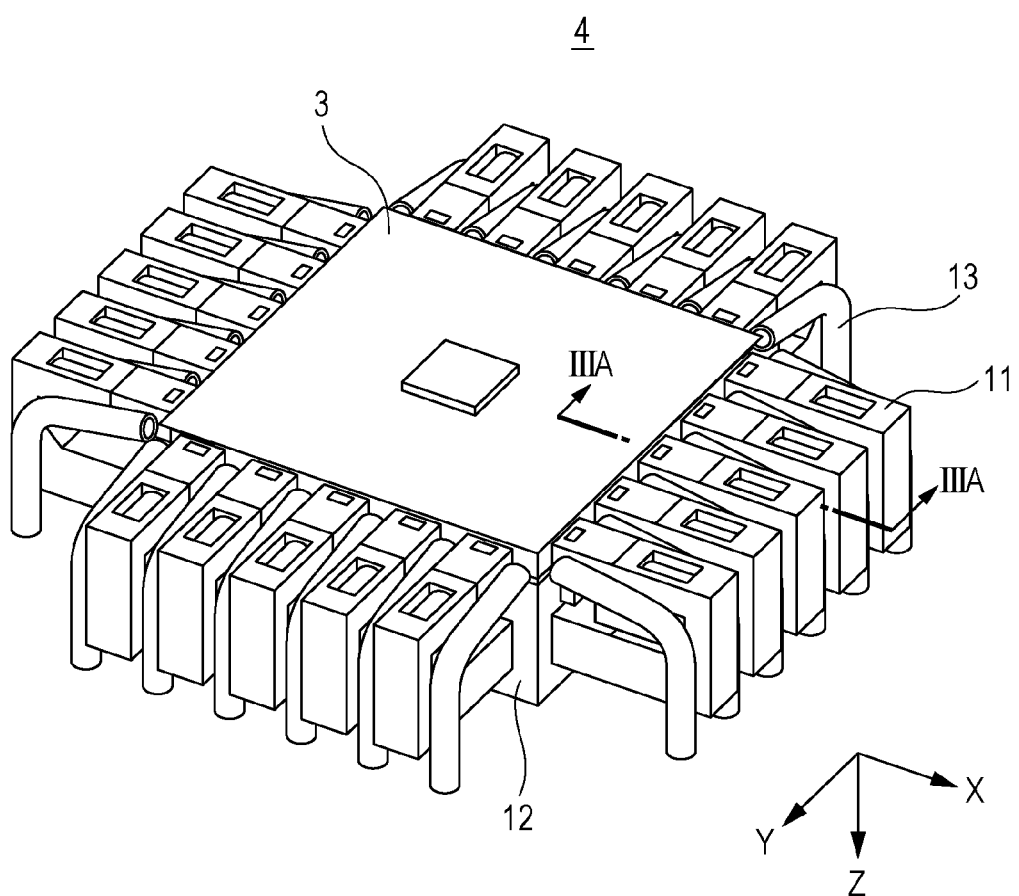
FIG. 2 is a schematic diagram illustrating an exemplary configuration of a mold holder according to an embodiment.

FIG. 2 is a schematic diagram of the configuration of the mold holder 4 according to the present embodiment included in the above-described imprint apparatus 1. FIG. 2 is a perspective view of the mold holder 4 when viewed from the substrate 5 side. The mold holder 4 includes a plurality of mold deforming mechanisms 11 and pipes 13 such that the mold deforming mechanisms 11 and the pipes 13 face four side surfaces of the mold 3. The pipes 13 are aligned with the mold deforming mechanisms 11. Each pipe 13 functions as both a gas supply mechanism and a gas recovery mechanism for supplying and recovering gas to and from the interface or spacing between the mold 3 and the substrate 5. In this embodiment, as illustrated in FIG. 2, five mold deforming mechanisms 11 are arranged for each side surface of the mold 3. In other words, twenty mold deforming mechanisms 11 are arranged around the mold 3. In addition, six pipes 13 are arranged for each side surface of the mold 3 such that each mold deforming mechanism 11 is sandwiched between the pipes 13. In other words, twenty-four pipes 13 are arranged around the mold 3. The number of arranged mold deforming mechanisms 11 may be appropriately changed depending on a target pattern shape or precision. The number or shape of pipes 13 may also be appropriately changed depending on the type or amount of gas supplied to the interface between the mold 3 and the substrate 5. The pipes 13 are used to supply gas, such as helium, from the gas supply unit (not illustrated). The leakage of gas supplied causes a measurement error of a measuring device, such as an interferometer, for position measurement which is typically disposed in the substrate stage 6. Adequate exhaust (recovery) is accordingly needed.

Figure 3A:
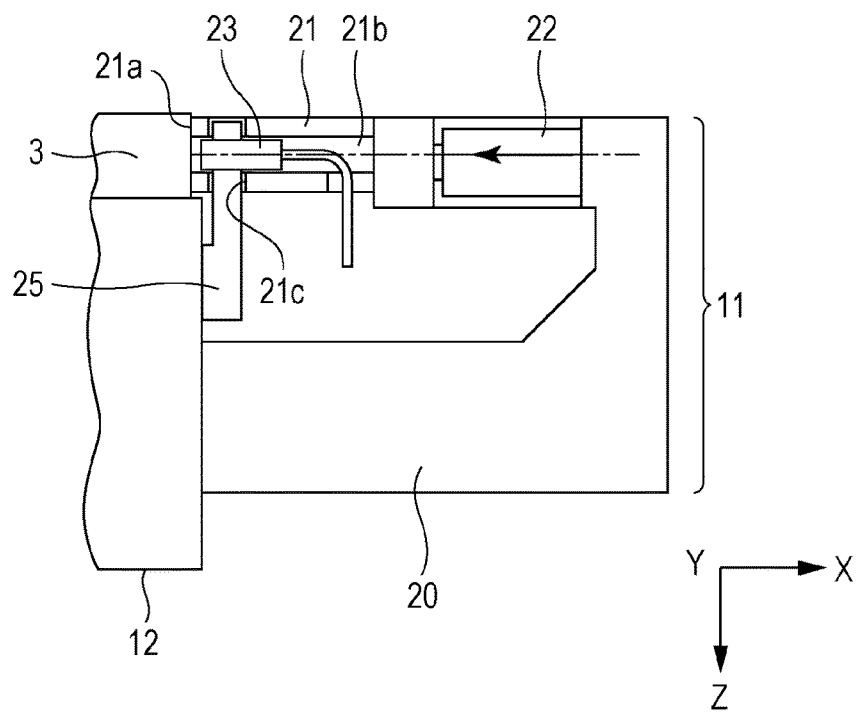
FIGS. 3A and 3B are schematic diagrams illustrating an exemplary configuration of a mold deforming mechanism.
Figure 3B:
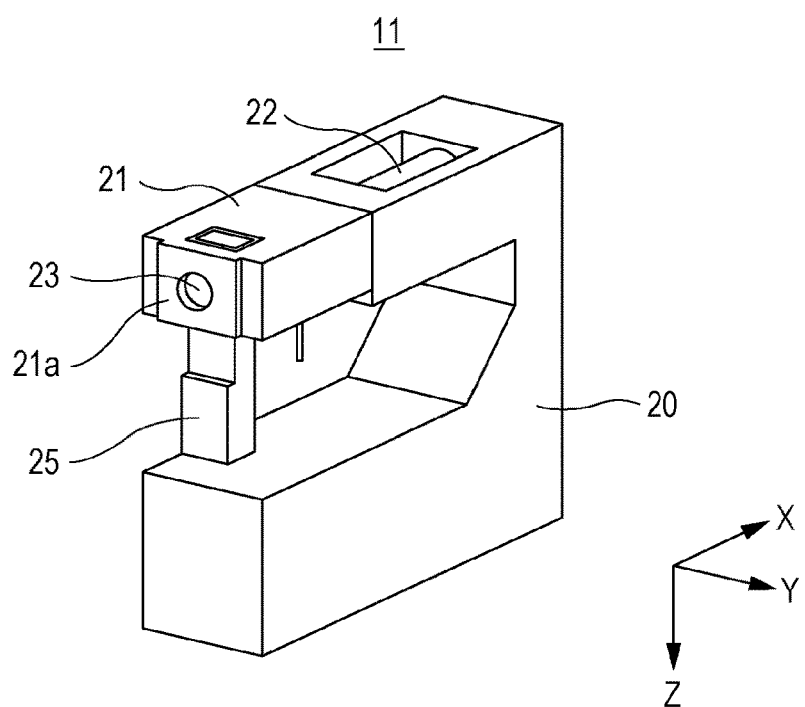

An exemplary configuration of the mold deforming mechanism 11 will now be described. FIGS. 3A and 3B are schematic diagrams illustrating the configuration of the mold deforming mechanism 11. FIG. 3A is a longitudinal sectional view illustrating the mold deforming mechanism 11 taken along the line IIIA-IIIA in FIG. 2. FIG. 3B is a perspective view of the mold deforming mechanism 11 when viewed from the mold 3 side. As illustrated in FIGS. 3A and 3B, the mold deforming mechanism 11 includes a pressurizing unit that includes a support 20, serving as a main body, a pressing member 21 fixed to the support 20, and an actuator 22. The support 20, which is a solid member having U-shaped side surfaces facing in the Y direction, is fastened to a side surface of the mold holding member 12. The pressing member 21 is a solid member movable in the X direction to apply a force (compressive force) to an area in a side surface of the mold 3 while a pressing face (contact face) 21a of the pressing member 21 is in contact with the area. The actuator 22 is a driving unit, disposed coaxially with a movement axis of the pressing member 21, to transfer a driving force (compressive force) to the pressing member 21 such that the driving force acts parallel to the pattern face of the mold 3. The actuator 22 drives the pressing member 21 so as to contact the pressing member 21 with the mold 3. As regards the actuator 22, for example, a piezoelectric element, a pneumatic actuator, or a direct-acting motor can be used. The pressing member 21 and the actuator 22 may be arranged at any positions relative to each other. The actuator 22 does not necessarily have to be disposed coaxially with the movement axis of the pressing member 21 as in the embodiment.

The mold deforming mechanism 11 may further include a position sensor (detector) 23 to measure the position and deformation of the mold 3. As regards the position sensor 23, for example, an optical sensor, an eddy-current sensor, or an electrostatic capacitance sensor can be used. In the mold deforming mechanism 11 provided with the position sensor 23, the pressing member 21 in this embodiment has a hole (opening) 21b inwardly extending from a central part of the pressing face 21a. The position sensor 23 is disposed within the hole 21b. Specifically, the pressing face 21a of the pressing member 21 is set so as to be centered about a measurement position of the position sensor 23. In this case, the pressing member 21 further has an inlet 21c extending through the pressing member 21 in a direction perpendicular to the hole 21b. The position sensor 23 is held by a sensor support 25 which is fastened to the mold holding member 12 and which extends in the hole 21b through the inlet 21c. Specifically, the position sensor 23 is not in contact with the pressing member 21 and the pressing member 21 is movable without coming into contact with the position sensor 23.

Figure 4:
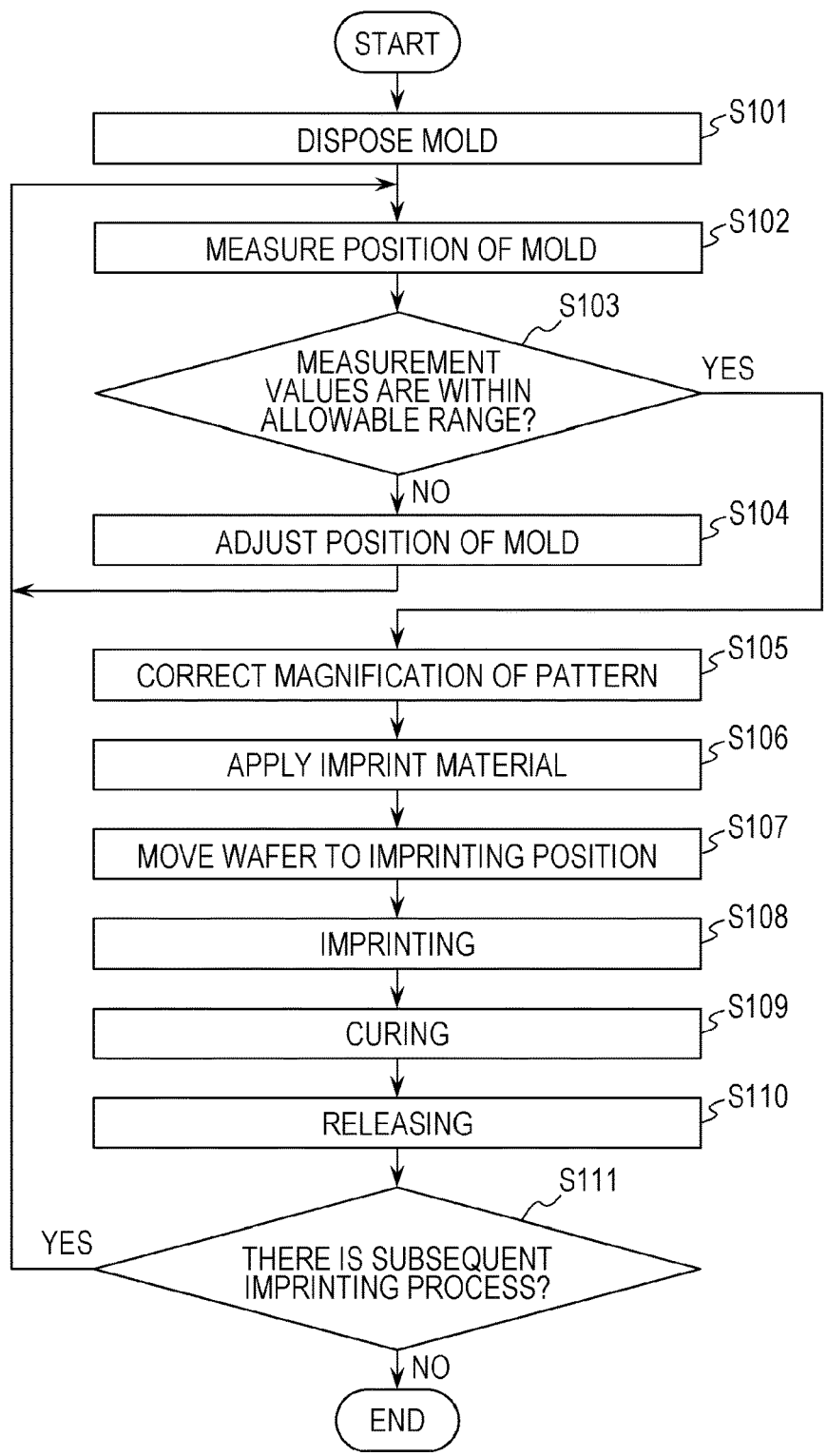
FIG. 4 is a flowchart of a process performed by the imprint apparatus according to the embodiment.

An imprinting process of forming a pattern on the substrate 5 using the imprint apparatus 1 including the mold holder 4 will now be described. FIG. 4 is a flowchart of a sequence of the imprinting process. When starting the sequence, the controller 9 allows the mold conveyor 8 to dispose the mold 3 on the mold holding member 12 (step S101). Then, the controller 9 allows three position sensors 23 arranged in at least three of the mold deforming mechanisms 11 of the mold holder 4 to measure the position of the mold 3 (step S102). In such a state, the pressing member 21 of each mold deforming mechanism 11 is not in contact with the mold 3. After that, the controller 9 determines whether measurement values (outputs) of the position sensors 23 are within a predetermined allowable range (step S103). When determining that the measurement values are not within the allowable range (NO in step S103), the controller 9 drives the mold deforming mechanisms 11 to adjust the position of the mold 3 such that at least one of a target position and a target shape is set to a target value (step S104).

After the position of the mold 3 is adjusted in step S104, the controller 9 returns to step S102. When determining that the measurement values are within the allowable range (YES in step S103), the controller 9 drives the mold deforming mechanisms 11 and corrects a magnification of the pattern shape so that the pattern in the mold 3 has a target shape (step S105). In this case, each mold deforming mechanism 11 drives the actuator 22 to press the pressing member 21 against the mold 3, thus deforming the mold 3. At this time, the controller 9 determines an amount of deformation based on the measurement values obtained by the position sensors 23. Alternatively, the deformation amount of the mold 3 may be determined based on a mark formed in the mold 3 and a mark formed on the substrate 5 detected by scopes 14 provided for the imprint apparatus 1. The mold 3 can be deformed based on the mark formed on the substrate 5 so that the mold 3 conforms to the shape of a shot area on the substrate 5.

The controller 9 drives the substrate stage 6 to move the substrate 5 to a coating position of the coating device 7 and allows the coating device 7 to apply the imprint material to the surface of the substrate 5 (step S106). The controller 9 further drives the substrate stage 6 to move the substrate 5 to an imprinting position (step S107). Then, the controller 9 performs an imprinting operation for pressing the mold 3 against the imprint material on the substrate 5 (or contacting the mold 3 with the imprint material) to fill the pattern formed in the mold 3 with the imprint material (step S108). The controller 9 performs a curing operation for curing or solidifying the imprint material on the surface of the substrate 5 by irradiating the imprint material in contact with the mold 3 with UV light (step S109). The controller 9 then performs a releasing operation for releasing the mold 3 from the cured imprint material by increasing the distance between the mold 3 and the substrate 5 (step S110). In step S111, the controller 9 determines whether there is a subsequent imprinting process. When determining that there is a subsequent imprinting process (YES in step S111), the controller 9 drives the substrate stage 6 to move the substrate 5 in order to perform the subsequent imprinting process and again returns to step S102. If it is unnecessary to measure the position of the mold 3 after the releasing operation in step S110, the controller 9 may proceed to step S105. On the other hand, when determining that there is no subsequent imprinting process (NO in step S111), the controller 9 terminates the imprinting process.

As described above, the controller 9 determines whether the measurement values, obtained by the position sensors 23, related to the position and deformation of the mold 3 are within the predetermined allowable range. In other words, the position sensors 23 are required to have high measurement accuracy. According to the present disclosure, each position sensor 23 is disposed without being in contact with the pressing member 21 as described above so that the measurement position is centered on the pressing face 21a to actually apply a compressive force to the mold 3, thus increasing the measurement accuracy.

Since a force is applied to the mold 3 during filling with the resin and during releasing, the position of the mold 3 may be shifted. For example, the position and deformation of the mold 3 may be continuously monitored by the position sensors 23. In this case, for example, after the releasing operation in step S110, the controller 9 may measure the position of the mold 3 using the position sensors 23 in a manner similar to step S102. If the position shift is not within the allowable range, the controller 9 may adjust the position of the mold 3 in a manner similar to step S104. As another way of adjusting the position of the mold 3 in step S104, the controller 9 may adjust an amount of position shift measured by the position sensors 23 by driving the substrate stage 6.

The deformation of the mold 3 in the mold position adjustment in step S104 or the pattern magnification correction in step S105 will now be described with reference to FIGS. 5A, 5B, 6A, and 6B.

FIGS. 5A and 5B are diagrams each illustrating a state of the mold 3 before the mold 3 is brought into contact with the imprint material on the substrate 5. FIG. 5A illustrates a state before the mold deforming mechanisms 11 apply a compressive force to the mold 3. In this state, each pressing member 21 is brought into contact with a side surface 3b of the mold 3 to apply a compressive force to the mold 3. As illustrated in FIG. 5A, the pressing member 21 includes an extremity (contact portion) 26 and an extremity holding portion 27. The extremity 26 can be made of a material that keeps a force applied to the mold 3 from concentrating. The extremity 26 may be made of highly elastic resin, such as fluorocarbon resin (e.g., Teflon (trademark)) or polyacetal (e.g., Delrin (trademark)). This reduces stress concentration to the mold 3, thus preventing the mold 3 from being broken. If each side surface 3b of the mold 3 is parallel to a contact face of the extremity 26 of the pressing member 21 and a force can be applied to a neutral position (neutral plane) 50 of the mold 3 in the Z direction as illustrated in FIG. 5B, a thin pattern portion 3a and its surrounding part of the mold 3 are deformed in the Z direction. When the mold 3 is curved in a coy direction, the length of the mold 3 in the X direction is not changed in a plane. The position of this plane is defined as the neutral position (neutral plane) 50.

Actually, however, a side surface 3b' of the mold 3 is not parallel to the contact face of the extremity 26 of the pressing member 21 in the mold deforming mechanism 11 in some cases, as illustrated in FIG. 6A, because the mold 3 has an individual difference, such as a manufacturing error. Considering the manufacturing cost of the mold 3, it is difficult to eliminate the above-described individual difference. When the mold deforming mechanisms 11 apply a compressive force to the mold 3 illustrated in FIG. 6A, the extremity 26 at a distance L1 from the neutral position 50 in the Z direction comes into contact with the side surface 3b'. In this case, the mold 3 is deformed unintendedly in the Z direction or laterally asymmetrically as compared with the case of FIG. 5B. Such deformation causes distortion of the pattern portion 3a of the mold 3, leading to lower overlay precision.

To reduce a likelihood that the pattern portion 3a will be distorted due to the individual difference of the mold 3, the extremity 26 of each pressing member 21 in this embodiment has a convex shape.

Conical or Pyramidal Convex

FIGS. 7A to 7C are schematic diagrams illustrating a conical or pyramidal extremity 26a of the pressing member 21. The extremity 26a may be either conical or pyramidal in shape. The extremity holding portion 27 holds the conical or pyramidal extremity 26a so that the vertex of the conical or pyramidal extremity 26a comes into contact with the side surface 3b of the mold 3. Since the contact portion of the pressing member 21 is the conical or pyramidal extremity 26a, the extremity 26a comes into contact with the neutral position 50 of the mold 3 if the side surface 3b of the mold 3 is sloped (i.e., not parallel to the Z direction). The position of the mold deforming mechanism 11 or the mold holding member 12 is adjusted so that the vertex of the conical or pyramidal extremity 26a comes into contact with the neutral position 50 of the mold 3.

Spherical Convex

The extremity 26 may have a spherical surface. FIG. 7D is a schematic diagram illustrating a spherical extremity 26b of the pressing member 21. The extremity holding portion 27 holds the spherical extremity 26b so that the top of the spherical extremity 26b comes into contact with the side surface 3b of the mold 3. Since the contact portion of the pressing member 21 is the spherical extremity 26b, the extremity 26b can contact with the neutral position 50 of the mold 3 as illustrated in FIG. 7D if the side surface 3b of the mold 3 is sloped as illustrated in FIG. 7A or 7C.

Angled Convex

In the conical or pyramidal extremity 26, the pressing face 21a of the pressing member 21 is point-like. When the pressing member 21 presses the side surface 3b of the mold 3, stress is concentrated on the side surface 3b of the mold 3. The mold 3 may be broken.

The extremity 26 can have such a shape that stress is not concentrated in order to prevent breakage of the mold 3. For example, the extremity 26 can have an angled shape (roof shape). FIGS. 8A and 8B are schematic diagrams illustrating an angled extremity 26c of the pressing member 21. FIG. 8A illustrates the angled extremity 26c (the pressing member 21) when viewed from the mold 3 side. A ridge line 61 of the angled extremity 26c is to contact with the side surface 3b of the mold 3. Since the area of contact between the extremity 26c and the side surface 3b is greater than that between the conical or pyramidal extremity 26a and the side surface 3b, stress concentration can be reduced. FIG. 8B illustrates contact of the pressing member 21 with the mold 3. The position of the mold deforming mechanism 11 or the mold holding member 12 is adjusted so that the ridge line 61 of the angled extremity 26c comes into contact with the neutral position 50 of the mold 3. Since the contact portion of the pressing member 21 is the angled extremity 26c, the extremity 26c can contact with the neutral position 50 of the mold 3 if the side surface 3b of the mold 3 is sloped. Furthermore, the concentration of a force applied to the mold 3 can be reduced.

Cylindrical Convex

To prevent the concentration of a force applied to the mold 3, the extremity 26 of the pressing member 21 can have a cylindrical surface. FIGS. 8C and 8D are schematic diagrams illustrating a cylindrical extremity 26d of the pressing member 21. FIG. 8C is a perspective view of the cylindrical extremity 26d. The cylindrical surface (curved surface) of the cylindrical extremity 26d is to contact with the side surface 3b of the mold 3. Since the area of contact between the cylindrical extremity 26d and the side surface 3b is greater than that between the spherical extremity 26b or the conical or pyramidal extremity 26a and the side surface 3b, stress concentration can be reduced. FIG. 8D illustrates contact of the pressing member 21 with the mold 3. The position of the mold deforming mechanism 11 or the mold holding member 12 is adjusted so that the cylindrical surface of the cylindrical extremity 26d comes into contact with the neutral position 50 of the mold 3. Since the contact portion of the pressing member 21 is the cylindrical extremity 26d, the extremity 26d can contact with the neutral position 50 of the mold 3 if the side surface 3b of the mold 3 is sloped. Furthermore, the concentration of a force applied to the mold 3 can be reduced.

As regards the shape of the extremity 26, it is only required that the dimension of part of the extremity 26 to contact with the side surface 3b of the mold 3 be less than the dimension of part of the extremity 26 away from the side surface 3b of the mold 3 (or adjacent to the extremity holding portion 27). Accordingly, the extremity 26 may be a stepped convex. For example, the cylindrical extremity 26d may be shaped such that a smaller cylindrical extremity having a smaller contact face is located in the middle of the curved surface facing the side surface of the mold 3. Accordingly, a pressure between the extremity 26 and the side surface 3b of the mold 3 is higher than a pressure between the extremity 26 and the extremity holding portion 27.

Condition of Neutral Position

It is difficult to align the contact face (contact point) of any of the extremities 26a to 26d with the neutral position 50 of the side surface 3b of the mold 3. Accordingly, for example, a range of 250 μm from the neutral position 50 of the mold 3 in the Z direction cab be defined as a neutral position allowable range and the extremity 26 can contact with this range. If the extremity 26 has an angled shape (FIGS. 8A and 8B), the ridge line 61 can lie within the range of 250 μm from the neutral position 50 of the mold 3 when coming into contact with the side surface 3b of the mold 3. It is accordingly necessary to suppress a slope extending from the ridge line 61 relative to the X-Y plane parallel to the pattern face of the mold 3. The size of the allowable range of the neutral position 50 can be appropriately determined depending on the shape of the mold 3.

Figure 9:
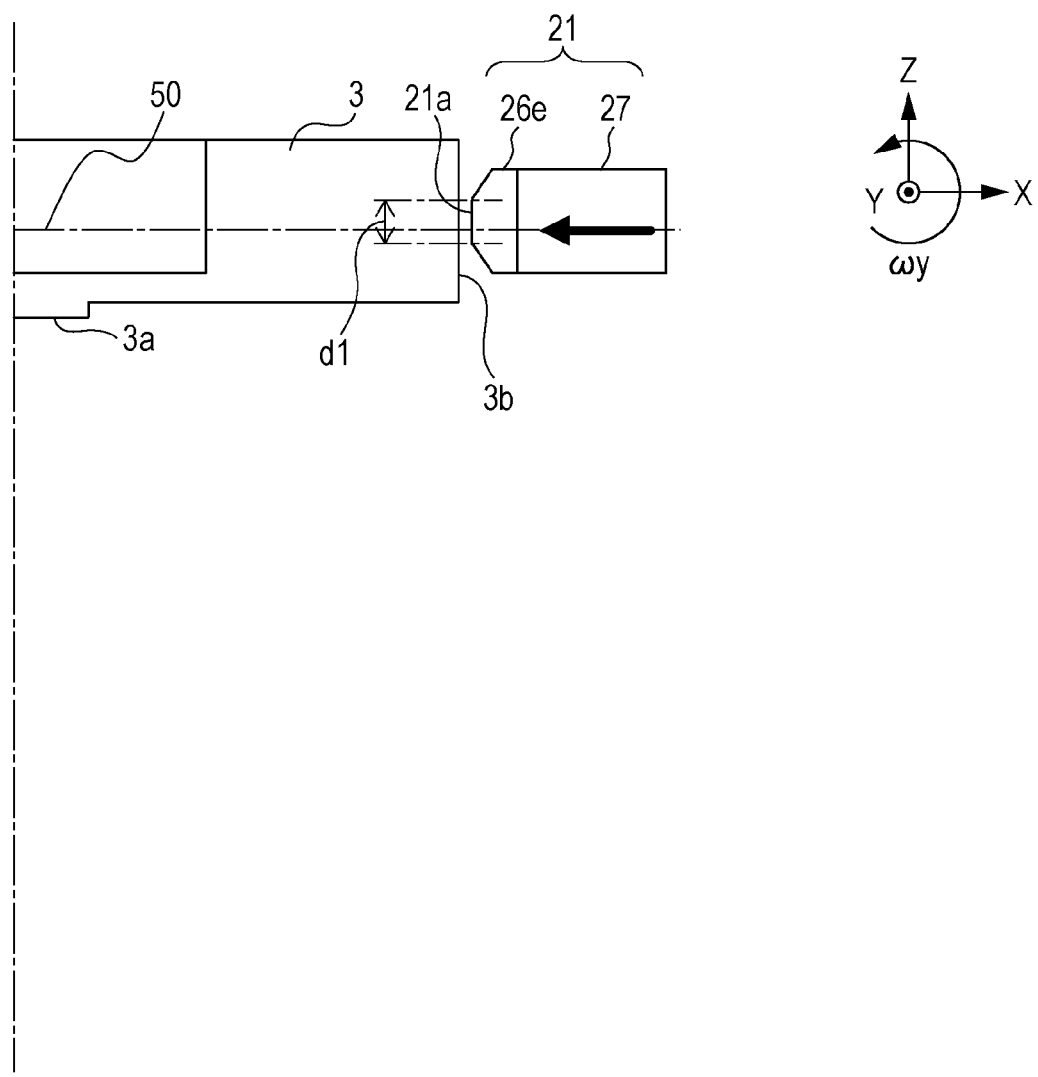
FIG. 9 is a diagram explaining a contact state of an extremity.

Modifications of Conical or Pyramidal Convex, Spherical Convex, Angled Convex, and Cylindrical Convex Contact part of any of the above-described extremities 26a to 26d to contact with the side surface 3b of the mold 3 may be flat so long as the contact face (contact point) of the extremity can contact with the above-described allowable range of the neutral position 50. For example, the conical or pyramidal extremity 26a may be shaped into a frustum (truncated cone or truncated pyramid) so as to have flat contact part to contact with the side surface 3b. FIG. 9 illustrates a truncated conical or pyramidal extremity 26e before coming into contact with the mold 3. The pressing face 21a of the truncated conical or pyramidal extremity 26e has a width dl up to 500 μm if the center of the pressing face 21a can be aligned with the neutral position 50. Accordingly, the width dl of the pressing face 21a has to be less than or equal to 500 μm. Similarly, each of the spherical extremity 26b, the angled extremity 26c, and the cylindrical extremity 26d can have a flat pressing face 21a. Accordingly, the pressing face of the extremity 26 has a narrower width than that of the side surface of the mold 3.

Pressing Member with Position Sensor

The shape of the extremity 26 of the pressing member 21 provided with the position sensor 23 will now be described. FIGS. 7A to 9 each illustrate the shape of the extremity 26 of the pressing member 21 with no position sensor 23. If the position sensor 23 is provided for the extremity 26, the shape of the extremity 26 has to be determined in consideration of the influence of the hole 21b.

Figure 10A:
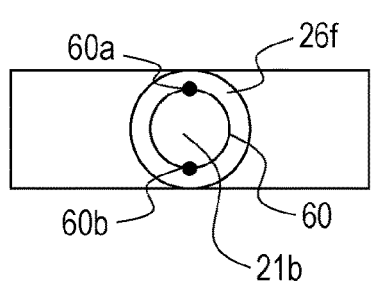
FIGS. 10A to 10D are diagrams explaining shapes of extremities each having a hole.
Figure 10B:
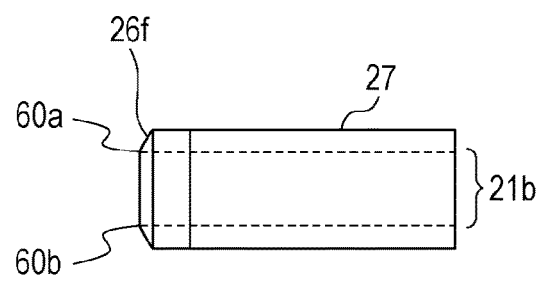

For example, FIGS. 10A and 10B illustrate an extremity 26f obtained by forming the hole 21b in the spherical extremity 26b. FIG. 10A illustrates the pressing member 21 when viewed from the mold 3 side. If the pressing member 21 includes the extremity 26f illustrated in FIGS. 10A and 10B, the position of contact of the extremity 26f with the side surface 3b varies depending on the slope of the side surface 3b of the mold 3. If the side surface 3b of the mold 3 is sloped as illustrated in FIG. 7A, a point 60a on a circle 60, illustrated in FIG. 10A, first comes into contact with the side surface 3b. If the side surface 3b is sloped as illustrated in FIG. 7C, a point 60b first comes into contact with the side surface 3b. Although the points 60a and 60b should ideally be located within a range of, for example, 250 μm from the neutral position 50 of the side surface 3b of the mold 3 as described above, it is actually difficult to set the distance between the points 60a and 60b to be less than or equal to 500 μm. Since the position sensor 23 typically has a diameter of a few millimeters, the hole 21b in which the position sensor 23 is disposed has to have substantially the same diameter. Accordingly, the distance between the points 60a and 60b is a few millimeters. If the side surface 3b of the mold 3 is sloped, the extremity 26f comes into contact with the side surface 3b at a position away from the neutral position 50. Unfortunately, the extremity 26f illustrated in FIGS. 10A and 10B may affect the pattern portion 3a of the mold 3.

Figure 10C:
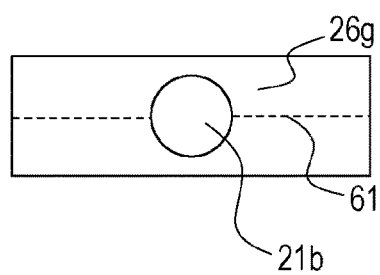
Figure 10D:
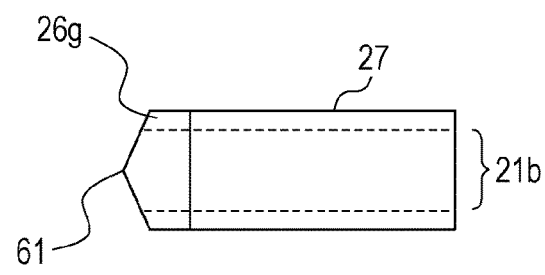

An extremity 26g obtained by forming the hole 21b in the angled extremity 26c will now be described. FIGS. 10C and 10D illustrates the extremity 26g. FIG. 10C illustrates the pressing member 21 when viewed from the mold 3 side. In the pressing member 21 including the extremity 26g illustrated in FIGS. 10C and 10D, the extremity holding portion 27 has to hold the extremity 26g so that the ridge line 61 faces the neutral position 50 of the mold 3. If the side surface 3b of the mold 3 is sloped as illustrated in FIG. 7A or 7C, the ridge line 61 illustrated in FIG. 10C first comes into contact with the side surface 3b of the mold 3. If the extremity 26g has the hole 21b to dispose the position sensor 23 in the pressing member 21, the extremity 26g can contact with the side surface 3b of the mold 3 at a position near the neutral position 50. The ridge line 61 may be allowed to intersect a straight line passing through the center of the hole 21b.

If the extremity 26 has no hole 21b and the pressing member 21 is not provided with the position sensor 23, the position sensor 23 may be disposed between the mold deforming mechanisms 11, for example.

Condition of Shape of Contact Portion

Figure 11:
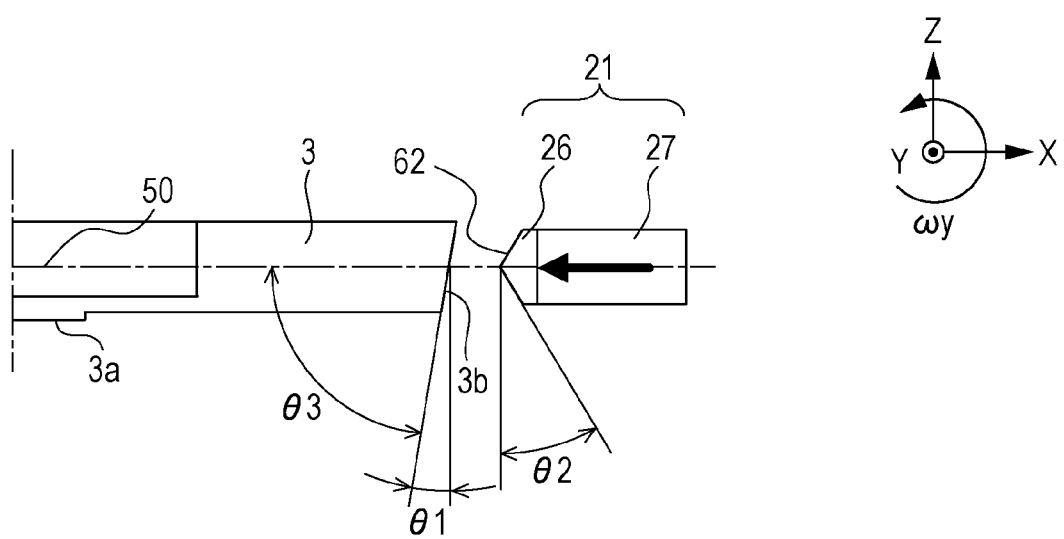
FIG. 11 is a diagram illustrating an angle formed by the side surface of the mold and a Y-Z plane and an angle formed by a side surface of the extremity and the Y-Z plane.

A slope surface (side surface) 62 of any of the extremities 26 (26a to 26e and 26g) which is not parallel to the face (X-Y plane) of the mold 3 in which the pattern is formed and the direction (Z direction) in which the mold 3 is moved to contact with the imprint material will now be described. FIG. 11 illustrates a longitudinal section of any of the above-described extremities 26 and a section of the mold 3.

With respect to the shape of the contact portion, to avoid or reduce stress concentration as much as possible, the convex shape of the extremity 26 may be as flat as possible to the extent that the extremity 26 is likely to contact with the neutral position 50 of the mold 3. If the extremity 26 is made of a material having low Young's modulus, this material is effective in reducing stress concentration but causes loss in driving stroke of the mold deforming mechanism 11. Accordingly, the material and thickness of the extremity 26 have to be determined so as to meet both stress constraints and stroke constraints.

As illustrated in FIG. 11, a plane (Y-Z plane) orthogonal to a pressing direction (X direction) of the pressing member 21 and the side surface (end surface) 3b of the mold 3 form a first angle $\theta 1$ and the Y-Z plane and the slope surface 62 of the extremity 26 form a second angle $\theta 2$. To prevent outer edge part of the extremity 26 from first coming into contact with the mold 3, it is only required that $\theta 1 < \theta 2$. An upper limit of the angle $\theta 2$ may be determined so as to meet both the stress constraints and the stroke constraints. A maximum value of the angle θ1, which corresponds to a slope of the side surface 3b of the mold 3, may be determined based on a manufacturing error. The slope of the slope surface 62 of the angled extremity 26c relative to the Y-Z plane may be in a range from 1 mrad to 10 mrad.

Shape of Mold

The shape of the extremity 26 is determined in consideration of, for example, allowable stress whereby the mold 3 is not broken or required driving stroke. As regards the conical or pyramidal extremity 26a or the truncated conical or truncated pyramidal extremity 26e shaped such that the surface perpendicular to the pressing direction is tapered toward the side surface 3b of the mold 3, if the mold 3 has a large individual difference, the mold 3 may be significantly deformed in the Z direction or laterally asymmetrically. An allowable value for the shape of the mold 3 has to be defined so that the deformation in the Z direction or the lateral asymmetric deformation is less than or equal to the allowable value if the mold 3 has an individual difference. For example, the shape of the mold 3 may be standardized so that a third angle θ3 formed by the side surface 3b of the mold 3 and the neutral plane 50 of the mold 3, as illustrated in FIG. 11, is greater than or equal to π/2−0.001 rad and is less than or equal to π/2+0.001 rad. If it is difficult to measure the angle formed by the neutral plane 50 and the side surface 3b of the mold 3, the shape of the mold 3 may be standardized so that an angle formed by a plane at which the mold holding member 12 chucks the mold 3 and the side surface 3b of the mold 3 is greater than or equal to π/2+0.001 rad and is less than or equal to π/2+0.001 rad.

As described above, the extremity 26 can have an angled shape. If the extremity 26 has a flat face, adjustment accuracy can be relaxed by standardizing the shape of the mold 3 so that the angle θ3 formed by the side surface 3b of the mold 3 and the neutral plane 50 of the mold 3 is greater than or equal to π/2−0.001 rad and is less than or equal to π/2+0.001 rad. Alternatively, the shape of the mold 3 may be standardized so that the angle formed by the plane at which the mold holding member 12 chucks the mold 3 and the side surface 3b of the mold 3 is greater than or equal to π/2−0.001 rad and is less than or equal to π/2+0.001 rad.

Method of Manufacturing Article

According to an embodiment of the present disclosure, a method of manufacturing, as an article, a device (e.g., a semiconductor integrated circuit element or a liquid crystal display element) includes patterning a substrate (e.g., a wafer, a glass plate, or a film-like substrate) using the above-described imprint apparatus. The method may further include etching the patterned substrate. If another article, such as a patterned medium (recording medium) or an optical element, is manufactured, the method may include another step of processing the patterned substrate, instead of etching. The method according to the present embodiment is advantageous in at least one of performance, quality, productivity, and production cost of the article over related-art methods.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2013-231575, filed Nov. 7, 2013, which is hereby incorporated by reference herein in its entirety.

What is claimed is:

1. An imprint apparatus for forming a pattern of an imprint material on a substrate by using a mold, the apparatus comprising:
   a mold holding member configured to hold the mold; and
   a mold deforming mechanism for applying a force to a side surface of the mold in a direction along a pattern face of the mold in which the pattern is formed in order to deform the pattern formed in the mold held by the mold holding member,
   wherein the mold deforming mechanism includes a contact portion to contact with the side surface of the mold to press against the side surface, and
   wherein, regarding the shape of the contact portion in a thickness direction of the moldy, a slope surface is formed such that a dimension of part of the contact portion to contact with the side surface of the mold is less than a dimension of part of the contact portion away from the side surface of the mold, and a slope of the slope surface of the contact portion is equal to or more than 1 mrad and equal to or less than 10 mrad with respect to a plane surface perpendicular to a pressing direction that the contact portion applies a pressing force from the side surface of the mold.

2. The apparatus according to claim 1, wherein the contact portion is conical or pyramidal in shape.

3. The apparatus according to claim 1, wherein the contact portion is truncated conical or truncated pyramidal.

4. The apparatus according to claim 1, wherein the contact portion is roof-shaped and has a ridge line to contact with the side surface of the mold.

5. The apparatus according to claim 4, wherein the ridge line of the roof-shaped contact portion is parallel to a neutral plane of the mold when coming into contact with the side surface of the mold.

6. The apparatus according to claim 1, wherein the mold holding member holds the mold such that when the contact portion comes into contact with the side surface of the mold, a contact position of the contact portion lies within a range of 250 μfrom a neutral plane of the mold in a direction along a thickness of the mold.

7. The apparatus according to claim 1,
   wherein the contact portion has an opening at a central part thereof, and
   wherein the apparatus further includes a detector configured to detect a position of the mold in a direction in which the mold deforming mechanism applies a force to the mold and the detector is disposed in the opening.

8. The apparatus according to claim 4,
   wherein the contact portion has an opening at a central part thereof,
   wherein the apparatus further includes a detector configured to detect a position of the mold in a direction in which the mold deforming mechanism applies a force to the mold and the detector is disposed in the opening, and
   wherein the opening is formed such that a straight line passing through a center of the opening intersects a straight line passing through the ridge line of the roof-shaped contact portion to contact with the side surface of the mold.

9. The apparatus according to claim 1, wherein an angle formed by the slope surface of the contact portion and a plane orthogonal to the direction in which the contact portion applies a force to the side surface of the mold is greater than an angle formed by the side surface of the mold and the plane orthogonal to the direction in which the contact portion applies the force to the side surface of the mold.

10. An imprint apparatus for forming a pattern of an imprint material on a substrate by using a mold, the apparatus comprising:
a mold holding member configured to hold the mold; and
a mold deforming mechanism for applying a force to a side surface of the mold in a direction along a pattern face of the mold in which the pattern is formed in order to deform the pattern formed in the mold held by the mold holding member,
wherein the mold deforming mechanism includes a contact portion to contact with the side surface of the mold to press against the side surface, and
wherein, regarding the shape of the contact portion in a thickness direction of the mold, a slope surface is formed such that a pressure of part of the contact portion to contact with the side surface of the mold is higher than a pressure of part of the contact portion away from the side surface of the mold, and a slope of the slope surface of the contact portion is equal to or more than 1 mrad and equal to or less than 10 mrad with respect to a plane surface perpendicular to a pressing direction that the contact portion applies a pressing force from the side surface of the mold wherein the contact portion is shaped such that a pressure of part of the contact portion to contact with the side surface of the mold is higher than a.

11. A method of manufacturing an article, comprising:
forming a pattern of an imprint material on a substrate using an imprint apparatus; and
processing the substrate using the pattern formed in the imprint material,
wherein the imprint apparatus for forming a pattern of imprint material on a substrate by using a mold, the apparatus including
a mold holding member configured to hold the mold, and
a mold deforming mechanism for applying a force to a side surface of the mold in a direction along a pattern face of the mold in which the pattern is formed in order to deform the pattern formed in the mold held by the mold holding member,
wherein the mold deforming mechanism includes a contact portion to contact with the side surface of the mold to press against the side surface, and
wherein, regarding the shape of the contact portion in a thickness direction of the mold, a slope surface is formed such that a dimension of part of the contact portion to contact with the side surface of the mold is less than a dimension of part of the contact portion away from the side surface of the mold, and a slope of the slope surface of the contact portion is equal to or more than 1 mrad and equal to or less than 10 mrad with respect to a plane surface perpendicular to a pressing direction that the contact portion applies a pressing force from the side surface of the mold.

12. An imprinting mold used for an imprint apparatus,
wherein an angle formed by a neutral plane of the mold and a side surface of the mold is greater than or equal to $\pi/2-0.001$ rad and is less than or equal to $\pi/2+0.001$ rad,
wherein the imprint apparatus for forming a pattern of an imprint material on a substrate by using a mold, the apparatus including
a mold holding member configured to hold the mold, and
a mold deforming mechanism for applying a force to a side surface of the mold in a direction along a pattern face of the mold in which the pattern is formed in order to deform the pattern formed in the mold held by the mold holding member,
wherein the mold deforming mechanism includes a contact portion to contact with the side surface of the mold to press against the side surface, and
wherein, regarding the shape of the contact portion in a thickness direction of the mold, a slope surface is formed such that a dimension of part of the contact portion to contact with the side surface of the mold is less than a dimension of part of the contact portion away from the side surface of the mold, and a slope of the slope surface of the contact portion is equal to or more than 1 mrad and equal to or less than 10 mrad with respect to a plane surface perpendicular to a pressing direction that the contact portion applies a pressing force from the side surface of the mold.

13. An imprinting mold used for an imprint apparatus,
wherein an angle formed by a plane at which the mold is held and secured to the imprint apparatus and a side surface of the mold is greater than or equal to $\pi/2-0.001$ rad and is less than or equal to $\pi/2+0.001$ rad,
wherein the imprint apparatus for forming a pattern of an imprint material on a substrate by using a mold, the apparatus including
a mold holding member configured to hold the mold, and
a mold deforming mechanism for applying a force to a side surface of the mold in a direction along a pattern face of the mold in which the pattern is formed in order to deform the pattern formed in the mold held by the mold holding member,
wherein the mold deforming mechanism includes a contact portion to contact with the side surface of the mold to press against the side surface, and
wherein, regarding the shape of the contact portion in a thickness direction of the mold, a slope surface is formed such that a dimension of part of the contact portion to contact with the side surface of the mold is less than a dimension of part of the contact portion away from the side surface of the mold, and a slope of the slope surface of the contact portion is equal to or more than 1 mrad and equal to or less than 10 mrad with respect to a plane surface perpendicular to a pressing direction that the contact portion applies a pressing force from the side surface of the mold.

* * * * *